US007893595B2

(12) United States Patent
Kaiser et al.

(10) Patent No.: US 7,893,595 B2
(45) Date of Patent: Feb. 22, 2011

(54) METHOD FOR GAP ADJUSTMENT OF TWO MECHANICAL ELEMENTS OF A SUBSTANTIALLY PLANAR MICROMECHANICAL STRUCTURE AND CORRESPONDING ELECTROMECHANICAL RESONATOR

(75) Inventors: Andreas Kaiser, Villeneuve d'Ascq (FR); Dimitri Galayko, Lille (FR); Dominique Collard, Lambersart (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 1701 days.

(21) Appl. No.: 10/495,639

(22) PCT Filed: Nov. 14, 2002

(86) PCT No.: PCT/FR02/03902

§ 371 (c)(1),
(2), (4) Date: Nov. 30, 2004

(87) PCT Pub. No.: WO03/043189

PCT Pub. Date: May 22, 2003

(65) Prior Publication Data

US 2009/0219113 A1     Sep. 3, 2009

(30) Foreign Application Priority Data

Nov. 15, 2001   (FR)   .................................. 01 14798

(51) Int. Cl.
*H02N 1/00* (2006.01)
*B81B 3/00* (2006.01)
(52) U.S. Cl. ...................... 310/309; 333/186; 361/289; 361/290
(58) Field of Classification Search ................. 310/309; 333/186, 200, 188; 361/289, 290, 291
See application file for complete search history.

(56) References Cited

U.S. PATENT DOCUMENTS 6,236,281 B1 *  5/2001  Nguyen et al. .............. 331/154

OTHER PUBLICATIONS

Hsu et al., "A Sub-Micron Capacitive Gap Process for Multiple-Metal-Electrode Lateral Micromechanical Resonators", Micro Electro Mechanical Systems, 2001, MEMS 2001. The $14^{th}$ IEEE International Conference on Micoelectromechanical Systems. Jan. 21-25, 2001. pp. 349-352.*
Hirano et al., Design, Fabrication, and Operation of Submicron Gap Comb-Drive Microactuators, Journal of Microelectromachanical Systems, vol. 1, No. 1, Mar. 1992.*
Hirano et al., "Operation of Sub-Micron Gap Electrostatic Comb Drive Actuators", Solid-State Sensors and Actuators, 1991. Digest of Technical Papers, Transducers '91., 1991 International Conference, Jun. 24-27, 1991, pp. 873-876.*

* cited by examiner

*Primary Examiner*—Karl I Tamai
(74) *Attorney, Agent, or Firm*—Stites & Harbison PLLC; Douglas E. Jackson; Stephen J. Weyer (57) ABSTRACT

The invention concerns a method for adjusting the operating gap of two mechanical elements of a substantially planar mechanical structure obtained by micro-etching. The method consists in attributing (A) to one of the elements (E) a fixed reference position (RF) in the direction of the residual gap separating said elements; connecting (C) the other element (OE) to the fixed reference position (RF) by an elastic link (S) and installing (D) between the fixed reference position (RF) and the other element (OE) at least a stop block defining an abutting gap, maximum displacement amplitude of the other element; subjecting (DE) the other element (OE) to a displacement antagonistic to the elastic link (S) up to the abutting position constituting the operating position, the residual gap being reduced to the difference between residual gap and abutting gap and less than the resolution of the micro-etching process. The invention is applicable to electromechanical resonators.

5 Claims, 4 Drawing Sheets

METHOD FOR GAP ADJUSTMENT OF TWO MECHANICAL ELEMENTS OF A SUBSTANTIALLY PLANAR MICROMECHANICAL STRUCTURE AND CORRESPONDING ELECTROMECHANICAL RESONATOR

The invention relates to a method for gap adjustment of two mechanical elements of a substantially planar micromechanical structure and to a corresponding electromechanical resonator.

In the field of microsystem technology, numerous applications require the use of structural layers called thick layers, the thickness of which is from 10 μm to 30 μm (1 μm=1 micron). Such thicknesses, which are relatively substantial, make it possible to form, in the micromechanical structures incorporating them, mechanical elements for anchoring mechanical elements that have a much lower inertia and that are to act as adjustable mobile elements.

On the other hand, an increase in the thicknesses of the layers, in order to form such mechanical anchoring elements, results systematically in an increase in the minimum producible planar dimensions of the above-mentioned elements and, consequently, in the lateral separation intervals between those elements. It will be recalled that all of the micro-etching processes currently available in the technical field under consideration are referred to as having a constant form factor, the form factor normally being defined as the ratio between the minimum planar or lateral dimensions and the thickness of those microstructures in the direction perpendicular to the above-mentioned dimensions.

Such microstructures are normally used in the field of radiofrequency circuits, in the frequency band from 10 MHz to 100 MHz.

In order to ensure radioelectric frequency tuning in the entire range of the above-mentioned frequency band, with the best fine-tuning, by adjusting the planar dimensions of those elements and the separation intervals thereof, the aforementioned separation intervals must be able to attain the lowest values, in particular separation interval values well below the normal resolution of the micro-etching processes used.

Of the known micromechanical structures constituted by micromechanical resonators, mention may be made of that described in the publication entitled "VHF Free-Free Beam High-Q Micro-mechanical Resonators" published by Kun Wang, Yinglei Yu, Ark-Chew Woung and Clara T.-C. Nguyen, Technical Digest, 12th International IEEE Micro Electro Mechanical Systems Conference, Orlando, Fla., Jan. 17-21, 1999, pp 453-458.

The above-mentioned resonator is suspended from flexible beams and is attracted electrostatically by a buried electrode in a direction at right-angles to the planar dimension of the substrate.

The technique described enables the air-gap of the resonator to be reduced from 1.5 μm to 0.3 μm.

However, that technique is limited to resonators that are excited vertically, in the direction at right-angles to the planar dimension of the substrate, by means of a buried electrode, which limits its application to thin-layer technologies.

The transfer of such a technique to thick layers requires voltage levels that are too high to be exploitable industrially.

In addition, such a technique requires several masking levels, multi-layer methods and micromachining operations which are rather complex and which may therefore be difficult to apply in an industrial method.

Finally, the above-mentioned technique considerably limits the freedom of design of the structures and therefore does not permit the exploitation of complex radiofrequency vibration modes which are very useful in radiofrequency sensors and/or resonators.

The use of thick-layer micromechanical structures and their application to the production of electromechanical resonators in accordance with the techniques of the prior art therefore prove to be very tricky and, consequently, the use of evolutive structures can also not be envisaged.

BRIEF SUMMARY OF THE INVENTION

The object of the present invention is to overcome the disadvantages and limitations of the prior art techniques by using a method for gap adjustment of two mechanical elements of a substantially planar micromechanical structure, which method makes it possible to adjust the separation interval values of elements of the micromechanical structure to values having a dimension much smaller than the resolution of the micro-etching process used to produce such micromechanical structures.

The present invention also relates to the use of a method for gap adjustment of two mechanical elements of a substantially planar micromechanical structure produced by thin-layer or thick-layer technology or by any type of technology, owing to the substantially planar structure of the above-mentioned mechanical structure.

The present invention also relates to the use of an electromechanical resonator circuit which has a substantially planar configuration and which therefore exhibits a very high degree of reliability and is very dynamic in terms of radioelectric frequency tuning adjustment.

The present invention also relates to the use of an electromechanical resonator circuit whose radioelectric resonance frequency can be adjusted with a high degree of precision by applying an electrical control voltage of low value.

The method for adjusting the operating gap of two mechanical elements of a substantially planar mechanical structure obtained by a micro-etching process, to which method the present invention relates, is applicable to mechanical elements formed by an element and by another element of that structure each comprising a substantially planar face, or edge, those faces or edges being arranged opposite each other, and having a residual gap substantially equal to the resolution of the micro-etching process.

The method is noteworthy in that it consists at least in assigning to one of the elements a fixed reference position in the structure and rendering the other element free relative to that element according to at least one degree of freedom in the direction of the residual gap.

It also consists in connecting the other element to the fixed reference position by a resilient link, that other element, in the presence of the resilient link, occupying a resting position for which the gap between each substantially planar face, which faces are arranged opposite each other, is substantially equal to the residual gap. It then consists in installing, between the element constituting the fixed reference position in the structure and the other element, rendered free, at least one stop block, in order to provide between the other element and that stop block an abutment gap defining the maximum amplitude of displacement of the other element between the resting position and an abutment position constituting the operating position.

The other element is then subjected to a displacement antagonistic to the resilient link as far as the abutment position constituting the operating position, the residual gap thus being reduced to an operating gap equal to the difference between that residual gap and the abutment gap and smaller than the resolution of the micro-etching process.

The electromechanical resonator circuit having an adjustable lateral air-gap, to which the present invention relates, is noteworthy in that it comprises at least, formed by a micro-etching process on a dielectric substrate and arranged in accordance with a substantially planar structure, one electrically conductive resonator element anchored in a structure having a fixed reference position, one other element constituting the signal electrode, the resonator element and the other element each having a substantially planar face, those faces being arranged opposite each other and being separated by a residual gap substantially equal to the resolution of the micro-etching process. The other element has a degree of freedom in the direction of the residual gap. An element for anchoring the other element constituting the signal electrode is provided and at least one resilient link connects the other element constituting the signal electrode and the anchoring element. The other element constituting the signal electrode, in the presence of the resilient link, occupies a resting position for which the gap between each substantially planar face, which faces are arranged opposite each other, is substantially equal to the residual gap. A stop block is also installed between the structure having a fixed reference position and the other element constituting the signal electrode, in order to provide between the other element and the stop block an abutment gap defining the maximum amplitude of displacement of the other element between the resting position and an abutment position constituting the operating position. Circuits for applying a difference in electrical potential between the other element constituting the signal electrode and an electrode which is fixed relative to the element constituting the resonator make it possible to form an electrostatic motor having an air-gap which is adjustable as a function of the difference in potential applied, which electrostatic motor is formed by the resonator element or an auxiliary electrode, the other element constituting the signal electrode, and the resilient link. The electrostatic motor enables the residual gap to be reduced to an operating gap equal to the difference between that residual gap and the abutment gap and smaller than the resolution of the micro-etching process.

The method and the resonator circuit to which the invention relates can be used in the manufacture of electromechanical resonators or filters for generating or discriminating between radiofrequency signals in frequency bands from 10 MHz to 100 MHz, for example.

They will be better understood on reading the description and observing the drawings hereinafter in which:

DETAILED DESCRIPTION OF THE INVENTION

A more detailed description of the method for adjusting the operating gap between two mechanical elements of a substantially planar mechanical or micromechanical structure obtained by a micro-etching process according to the subject-matter of the present invention will now be given in conjunction with FIG. 1.

In general, with reference to the above-mentioned Figure, what is being considered is a micromechanical structure, such as, for example, an electromechanical resonator formed on a substantially planar micromechanical structure obtained by micro-etching.

The mechanical elements of the micromechanical structure are formed by an element E and by another element OE, each element comprising, for example, a substantially planar face, or edge, and each of the aforementioned faces being arranged opposite the other and having a residual gap obtained owing to the etching or micro-etching process used. The residual gap is therefore substantially equal to the resolution of the micro-etching process.

When the micromechanical structure is that of an electromechanical resonator, it will be appreciated in particular that the above-mentioned residual gap is the limiting value of the air-gap of the micromechanical resonator, the residual gap therefore corresponding to a lower limit of the gap value and of the air-gap value finally obtained merely by using the micro-etching process.

In those conditions, the method, to which the invention relates, for adjusting the operating gap of two mechanical elements, such as the element E and the other element OE, consists, starting from their respective positions and from the residual gap Dres separating them, in assigning at a step A to one of the elements, for example, the element E, a fixed position called the reference position RF in the above-mentioned micromechanical structure.

Step A is followed by a step B which consists in rendering free according to at least one degree of freedom, in the direction of the above-mentioned residual gap Dres, the other element OE relative to the element E and of course relative to the fixed reference position of the latter.

Step B is followed by a step C which consists in connecting the other element OE, which has been rendered free, to the fixed reference position RF by a resilient link S. The other element OE, in the presence of the connection and the resilient link S, occupies a resting position for which the gap between each substantially planar face, which faces are arranged opposite each other, is substantially equal to the residual gap Dres.

Step C can then be followed by a step D which consists in installing between the element E, constituting the fixed reference position RF, and the other element which has been rendered free, OE, at least one stop block B in order to provide an abutment gap Dbut between the other element OE and the stop block B. The abutment gap is selected in such a manner as to have a predetermined value enabling the maximum displacement amplitude of the other element OE between the resting position and the abutment position constituting the operating position to be defined.

Step D is then followed by a step DE which consists in subjecting the other element OE to a displacement antagonistic to the resilient link S as far as the abutment position constituting the operating position. This enables the residual gap to be reduced to an operating gap e equal to the difference between the residual gap and the abutment gap and smaller than the resolution of the micro-etching process.

The operating gap between the element E and the other element OE then bears out the relationship:

$$e = Dres - Dbut.$$

The method to which the present invention relates may advantageously be used to adjust the operating gap of an electromechanical resonator and, in particular, the air-gap thereof.

In those conditions, the element E and the other element OE are constituted by an electrically conductive material obtained, for example, by micro-etching a polysilicon substrate placed on a dielectric substrate for example, in accordance with the technique of integrated circuit micro-etching.

Figure 1:
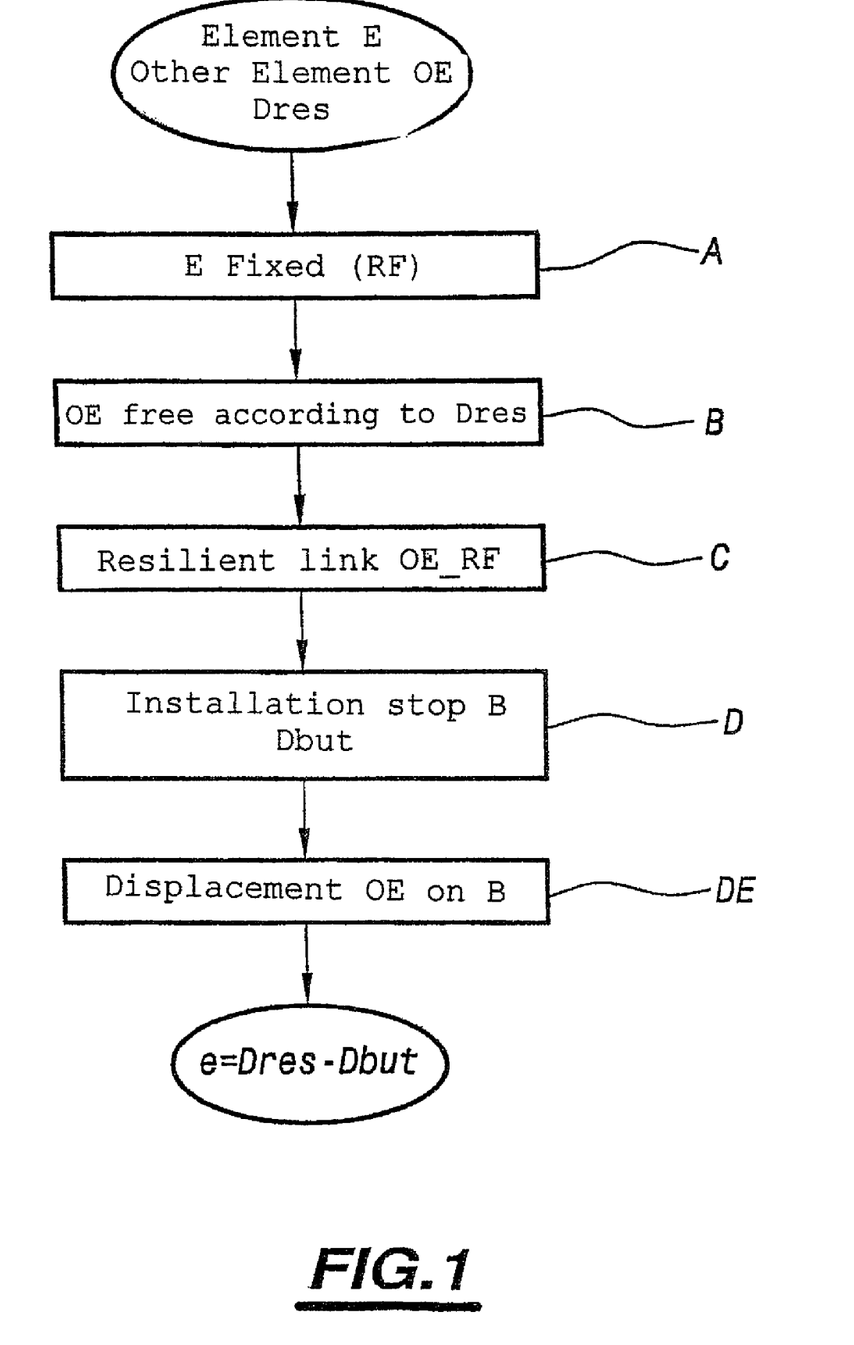
FIG. 1 shows, purely by way of example, a block diagram of the steps for implementing the method to which the present invention relates.

In those conditions, the step consisting in subjecting the other element, OE, to a displacement antagonistic to the resilient link S as shown in step E of FIG. 1 may advantageously consist in applying between the other element OE and a fixed electrode FE connected to the element E, in particular to the fixed reference position RF, a specific difference in electrical potential. In those conditions, the assembly formed by the fixed electrode connected to the element E, the other element OE and the resilient link S, and the applied difference in electrical potential constitute an electrostatic motor having an adjustable air-gap.

Figure 2A:
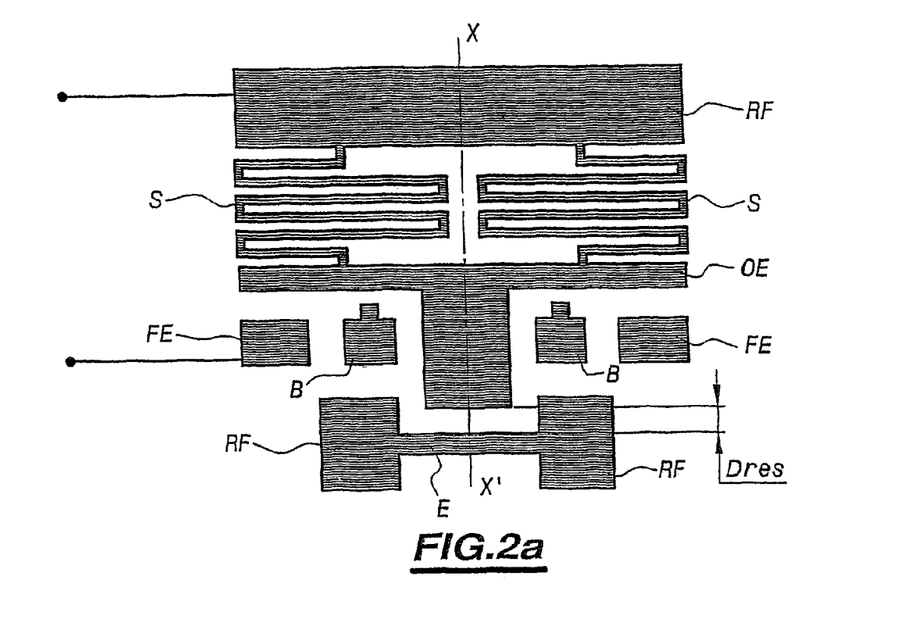
FIGS. 2a and 2b show in a plan view, respectively, an electromechanical resonator circuit in a resting position, no difference in electrical potential being applied between the element constituting the resonator and the other element constituting the signal electrode, the other element consequently being in the resting position, and that same electromechanical resonator circuit when a difference in electrical potential is applied in order to bring the other electrode into an abutment and operating position.
Figure 2B:
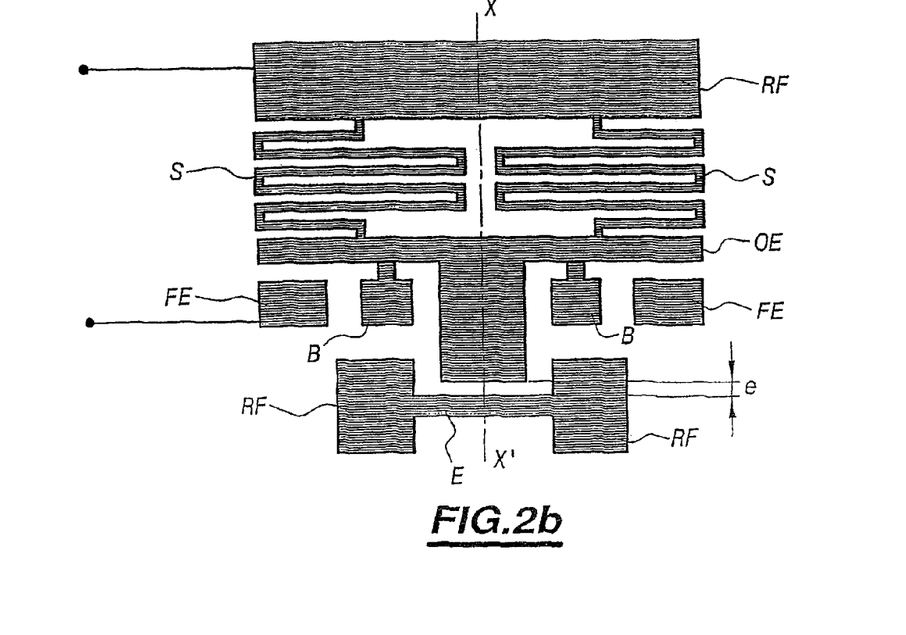

The implementation of the method to which the present invention relates in those conditions is shown in FIGS. 2a and 2b, respectively.

FIG. 2a shows all of the elements in a plan view, the elements made of electrically conductive polysilicon material being shown in grey tint in the plane of the Figure and being constituted by strips of polysilicon material placed on a dielectric substrate which is not shown in the drawing.

It will be appreciated in particular that the anchoring of the element E constituting a resonator is effected relative to mechanical masses RF providing the above-mentioned fixed position and that the other element OE constituting the signal electrode is in fact subdivided into a mobile portion OE and a fixed portion providing the fixed reference position RF, the other element OE which constitutes the signal electrode and the anchoring portion which constitutes the fixed reference position RF being connected mechanically by the resilient link constituted by two meandering elements S in FIGS. 2a and 2b.

In FIG. 2a, the difference in electrical potential applied between the fixed electrode FE and the anchoring element providing the fixed reference position RF of the other element OE constituting the signal electrode is substantially zero. In those conditions, the gap between the element E and the other element OE constituting the signal electrode corresponds to the residual gap Dres.

In FIG. 2b, on the other hand, in the case of the application of a difference in potential V other than zero, for example greater than zero, the electrostatic motor thus constituted enables the other element OE, constituting the signal electrode rendered mobile, to be displaced towards the element E, and thus enables the gap value to be reduced to the operating gap e in the conditions previously mentioned in the description.

The final position corresponds to the abutment position on the stop blocks B placed, for example, in the vicinity of the fixed electrode FE.

The method to which the present invention relates would appear to be particularly advantageous when the micromechanical structure constituting the structure of an electromechanical resonator and, in particular, the element constituting the resonator element E, the other element OE, constituting the signal electrode, and the resilient link are formed by substantially planar electrically conductive structures on a dielectric substrate.

In those conditions, the mechanical resonance frequency of the element E, constituting the resonator, represents the operating frequency of the signal of the resonator in lateral vibration mode.

A more detailed description of a resonator circuit and of an electromechanical resonator according to the subject-matter of the present invention will now be given in conjunction with FIGS. 2a and 2b and FIG. 3.

In general, it should be noted that the resonator circuit and the electromechanical resonator having an adjustable lateral air-gap, which are in accordance with the subject-matter of the present invention, comprise electrically conductive mechanical elements formed by a process of micro-etching on a dielectric substrate, those elements being arranged in accordance with a substantially planar structure.

The element E constitutes an electrically conductive resonator element and is anchored in a structure representing the fixed reference position RF.

The other element OE and the resonator element E have a planar edge or face, which edges or faces are arranged opposite each other, and are separated in the resting position, that is to say, in the absence of the application of the displacement of the other element OE constituting the signal electrode, by the residual gap previously mentioned in the description. The other element OE is separated, that is to say, disconnected, from the fixed reference position RF, in order to have a degree of freedom in the directions of the above-mentioned residual gap. It is, however, connected by a resilient link, such as, for example, a spring S, formed by a meandering polysilicon structure. The aforementioned meandering structure may be constituted by two basic meandering structures arranged symmetrically relative to a longitudinal axis of symmetry X'X of the above-mentioned resonator circuit. The meandering structures connect the other element OE, constituting the signal electrode, to the anchoring element constituting the fixed reference position therefor.

As regards the stop blocks B, they are installed between the structure having the reference position and the other element OE constituting a signal electrode in order to provide, between the other element OE and the stop block(s) B, an abutment gap as previously mentioned in the description. The abutment gap defines the maximum displacement amplitude of the other element OE, that is to say, of the signal electrode, between the resting position and the abutment position constituting the operating position.

Finally, the resonator circuit as shown in FIG. 2a or 2b comprises circuits permitting application of the difference in potential, namely the continuous difference in potential, between the other element, OE, and a fixed electrode FE, which is fixedly joined mechanically to the element E by way of the fixed reference position RF to form the electrostatic motor, as previously mentioned in the description.

In FIG. 2a and FIG. 2b, it should be noted that the circuits for applying the difference in potential are represented diagrammatically by electrical lines connected, respectively, to the fixed electrode FE and to the anchoring portion providing the fixed reference position RF for the other element OE constituting the signal electrode.

In operation, it should be noted that the signal electrode constituted by the other element OE is not subjected directly to the bias voltage enabling the above-mentioned difference in potential to be applied but by way of the resilient link formed by the springs S. Under the action of electrostatic fields thus created between the electrodes of the motor, namely the fixed electrode FE and the signal electrode formed by the other element OE, the signal electrode approaches the fixed electrode FE and the element E forming the resonator and places itself in the operating position, that is to say, on the stop blocks B.

In those conditions, the operating air-gap e bears out the relationship mentioned previously in the description, which is constituted by the difference between two gaps generated by the micro-etching process. The operating gap therefore has values much smaller than the micro-etching gaps which are the gap limits inherent in the micro-etching process used.

It should be noted that the method to which the present invention relates enables resonator circuits to be used industrially owing in particular to the insensitivity, of the method to which the present invention relates, to the phenomenon of over-etching of the structural layer. During the micromachining of the thick layer of silicon, the edges of the structure or microstructure are consumed over a width close to from 3 to 5% of the thickness to be etched, that is to say, from 0.6 µm to 1 µm of lateral etching, for a layer of 20 µm thickness. This phenomenon of lateral over-etching reduces the size of the etched elements and increases the width of all the gaps. The width of silicon consumed on the edges is therefore unpredictable because it depends on the conditions of the micro-etching processes but remains constant on adjacent patterns. Such a phenomenon of over-etching therefore does not enable accurate dimensioning of the structures and of the gaps associated therewith to be provided for.

In contrast, the use of the method to which the present invention relates permits the definition of resonators comprising operating gaps, that is to say, having an operating air-gap between the element E constituting the resonator and the other element OE constituting the signal electrode, which are determined by the difference between the widths of two residual gaps. Since the over-etching phenomenon known from the prior art is of course present and constant for the two gaps, the effect of that phenomenon is cancelled out by difference and the over-etching phenomenon is therefore substantially suppressed and does not appear in the final value of the operating gap. In those conditions, the final gap is defined solely by the lithography masks. It will be appreciated that the lithography masks make it possible to define not only the above-mentioned displacements but also the thicknesses of stop blocks which, of course, determine the displacement value of the signal electrode constituted by the other element OE.

Figure 3:
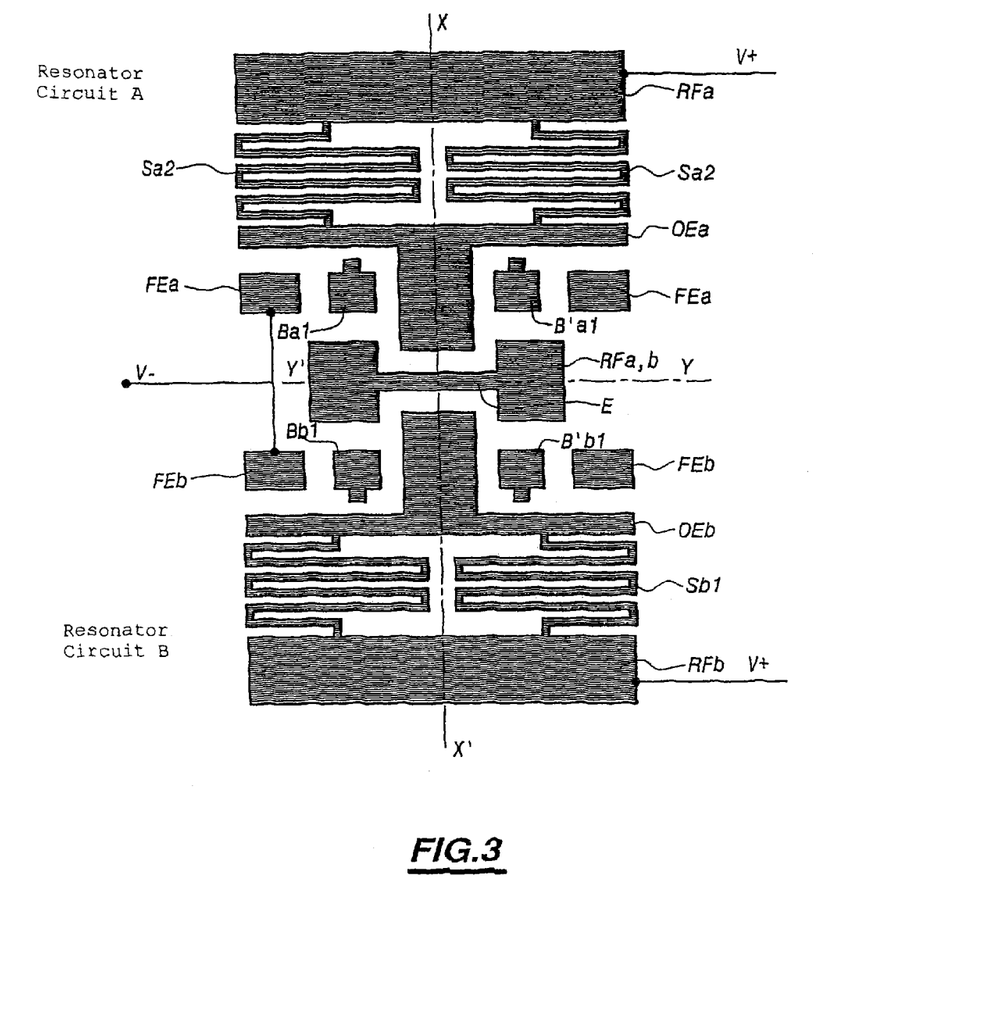
FIG. 3 shows a specific embodiment of a resonator, comprising two resonator circuits, as shown in FIGS. 2a and 2b, arranged head to tail.

FIG. 3 shows an electromechanical resonator produced thanks to the use of the method to which the present invention relates.

While the resonator circuit as represented in FIGS. 2a and 2b has a structure which is substantially symmetrical relative to a longitudinal axis of symmetry X'X substantially parallel with the residual gap Dres, the electromechanical resonator to which the present invention relates, as shown in FIG. 3, comprises a first resonator circuit, called resonator circuit A, and a second resonator circuit, called resonator circuit B, as previously described in the description in conjunction with FIGS. 2a and 2b.

The resonator circuits A and B are arranged head to tail symmetrically relative to an axis Y'Y at right-angles to the longitudinal axis of symmetry X'X.

In FIG. 3, the same references represent the same elements as in the case of FIGS. 2a and 2b, those references having, however, the subscripts $a$ and $b$, respectively, in relation to each of the resonator circuits A and B.

Thus, each resonator circuit comprises a first and a second spring Sa1, Sa2 and Sb1, Sb2, respectively, each providing a resilient link, and a set of stop blocks Ba1, B'a1 and Bb1, B'b1, respectively. The stop blocks maintain in the operating position the other element $OE_a$ and $OE_b$, respectively, constituting the signal electrode of each resonator circuit.

As regards the circuits for applying the difference in potential, they are shown diagrammatically in FIG. 3 by simple power supply lines and may be constituted by micro-connections which permit the application of a positive and negative voltage to the anchoring elements RFa, RFb and to the fixed electrodes FEa, FEb, respectively.

The resonator, as shown in FIG. 3, was used starting from two substantially identical resonator circuits of the fixed beam type in lateral vibration mode and had the following dimensions: length 40 µm, width 3 µm, thickness 15 µm, those dimensions being the design dimensions without taking into account the over-etching phenomenon, which is substantially suppressed thanks to the use of the method to which the present invention relates.

The following measurement results were obtained with an operating gap $e$ defined at the value of 0.2 µm for one of the resonators and 0.4 µm for the other resonator. The effective dimensions of the resonator circuits constituting the resonators are given in the following table:

| Name of parameter | Value |
| --- | --- |
| Length of the beams of resonator E, µm | 40 |
| Width of the beams of resonator E, µm | 3 |
| Thickness of the beams, µm | 15 |
| Initial distance between the signal electrode OE and the resonator E Dres | 1.8/2.0* |
| Initial distance between the signal electrode OE and the stops B, Dbut, µm | 1.6 |
| Initial distance between the signal electrode OE and the motor electrodes, Dmot, µm | 3.1 |

*1.8 µm for the resonator with the gap designed to be 0.2 µm, 2.0 µm for the resonator with the gap designed to be 0.4 µm.

It should be noted that, for the resonator having an operating gap of 0.2 µm, the residual gap was 1.8 µm, while for the other resonator the same residual gap was 2 µm for an operating gap of 0.4 µm.

The adjustment of the operating gap $e$ for the one and the other resonator was found to be particularly reliable for each of the above-mentioned resonators. The voltage necessary to ensure the approach of the signal electrodes was a maximum of 30 volts.

After the approach operation, that is to say, the displacement of the signal electrode formed by the other element $OE_a$ and $OE_b$, respectively, those electrodes continue to bear against the stop blocks and, in order to return to the resting state, the direct-current voltage applied has to be reduced to 20 volts.

Figure 4A:
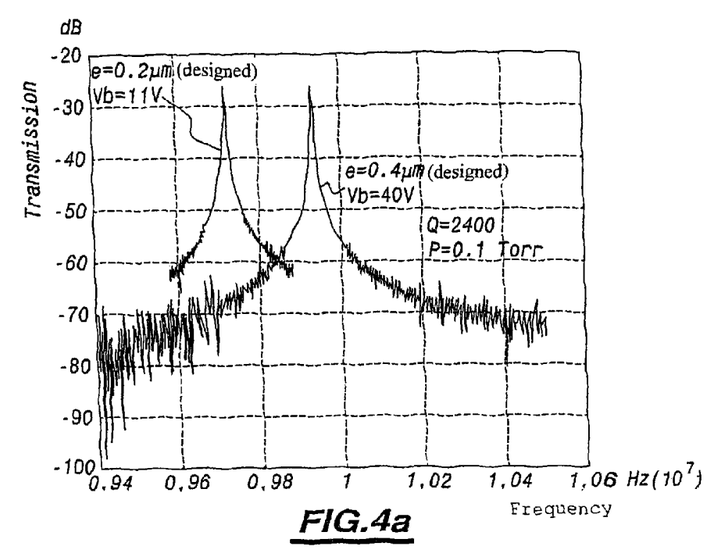
FIG. 4a shows a transmission characteristic, namely attenuation, as a function of the frequency for a first specific resonator circuit and a second specific resonator circuit which constitute a resonator, as shown in FIG. 3.
Figure 4B:
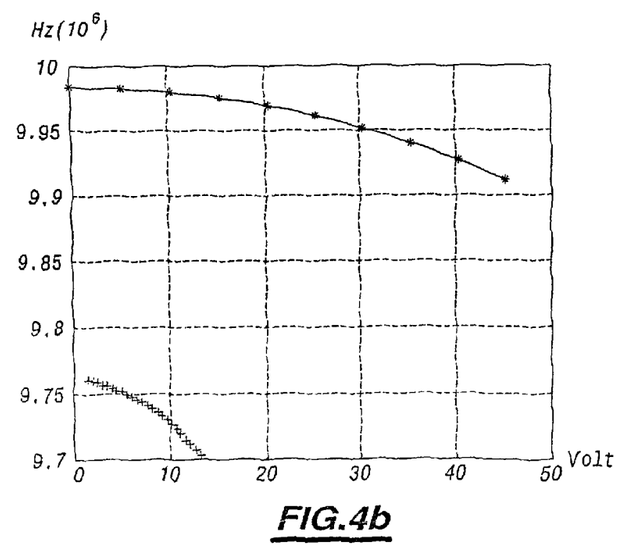
FIG. 4b shows a frequency tuning characteristic as a function of the difference in electrical potential, or bias voltage, applied between the resonator element and the other element constituting the signal electrode for a first specific resonator circuit and a second specific resonator circuit which constitute a resonator, as shown in FIG. 3.

FIGS. 4a and 4b show some experimental results relating to the resonator used in accordance with FIG. 3 for each resonator.

FIG. 4a shows the transmission characteristic of each resonator, as a function of the excitation frequency, at a constant bias voltage of each resonator circuit. The ordinate axis is graduated in attenuation, that is to say in dB, and the abscissa axis is graduated in frequency.

FIG. 4b shows the evolution characteristic of the resonance frequency of each resonator, the ordinate axis being graduated in frequency and the abscissa axis being graduated in applied difference in potential or voltage value.

The natural frequency of the resonator circuits and of the resonators corresponds to a biasing of substantially zero. That natural frequency is obtained by extrapolation from the curves of FIG. 4b. An applied difference in potential or bias voltage of zero causing amplitudes that are too small to be detected. While in theory the natural frequencies of the two resonators should be substantially identical, the difference between them, approximately 2%, is attributable to the dispersions associated with micromanufacturing techniques.

In FIG. 4b, the slope of the curve corresponding to the resonator having an operating gap reduced to 0.2 μm is much steeper than that of the resonator whose operating gap is reduced only to 0.4 μm. That effect is unequivocal evidence of a better coefficient of transduction for the resonator having the smaller operating gap. Owing to the fact that all of the other transduction parameters of the two resonators are identical, it may be deduced therefrom that the residual gap is smaller for the resonator designed for an operating gap of 0.2 μm. Such measurements attest to the quality of the improvements afforded by the method to which the present invention relates and the resonator circuits and resonators so obtained.

Finally, investigations have shown that the real values of the operating gaps, as mentioned in the above table, are therefore close to the values designed at the design stage of the manufacturing masks. It was thus possible to reduce the operating gap from 3 μm to 0.2 μm or 0.4 μm, respectively, for the above-mentioned resonators.

In relation to FIG. 4a, it should be noted that the transmission characteristics of the two resonators were laid down for constant applied differences in potential. The aforementioned differences in potential, or bias voltages, were chosen in order to obtain levels of transmission identical to the resonance frequency of each resonator. It will be appreciated in particular that, for the maximum transmission value, i.e. minimum attenuation, the aforementioned bias voltages are in a ratio substantially equal to 3.6. The aforementioned ratio makes it possible to determine a factor close to the value 2 between the operating gaps of the two resonators which correspond to the design values 0.2 and 0.4 μm.

In a comparable situation using resonator circuits in accordance with the prior art techniques, that is to say, in the absence of the improvements afforded by the method to which the present invention relates, comparable characteristics, for a residual gap of 3 μm, would have required a bias voltage, or an applied difference in potential, close to 2500 V, which would exclude effective industrial application of the prior art techniques.

A description has thus been given of a method for the gap adjustment of two mechanical elements of a substantially planar micromechanical structure, and of a resonator circuit and a corresponding resonator, that are particularly advantageous.

In particular, the electrostatic motor architecture used enables submicron operating gaps to be obtained, using standard silicon micro-etching technologies with a single structural layer, the structural layer of polysilicon being placed on a dielectric material, for example.

While the great difficulties of using sufficiently small gaps constitute a major obstacle to the use of standard micro-etching technologies for the manufacture of microelectromechanical filters or actuators under very low voltage, the method to which the present invention relates provides complete freedom from such an obstacle while no modification of the micro-etching processes is necessary.

It should also be noted that, although the use of mobile electrodes, in particular the signal electrode, requires an additional electrical bias source, such a requirement does not in any case represent a major constraint because the direct-current voltage of 30 V, in the absence of consumed current, can be readily generated even in portable systems.

Finally, while a single electrode FE is represented in the embodiment described, the fitting of several electrodes may be envisaged when the structure of the element E constituting the resonator is different from that of a lamina.

The invention claimed is:

1. An electromechanical resonator circuit having an adjustable lateral air-gap, comprising a first resonator circuit and a second resonator circuit, each resonator circuit comprising:
   at least one electrically conductive resonator element anchored in a structure having a fixed reference position, and being formed by a micro-etching process on a dielectric substrate and arranged in accordance with a substantially planar structure,
   another element, constituting a signal electrode, the resonator element and the other element each having a substantially planar face, which faces are arranged opposite each other and are separated by a residual gap substantially equal to the resolution of the micro-etching process, the other element having a degree of freedom in the direction of the residual gap;
   an anchor element for anchoring the other element constituting the signal electrode at least one resilient link connecting the other element constituting the signal electrode and the anchor element for anchoring the other element constituting the signal electrode, the other element constituting the signal electrode, in the presence of the at least one resilient link, occupying a resting position for which the gap between each substantially planar face, which faces are arranged opposite each other, is substantially equal to the residual gap;
   at least one stop block installed between the structure having a reference position and the other element constituting the signal electrode, in order to provide between the other element and the at least one stop block an abutment gap, of predetermined value, defining a maximum displacement amplitude of the other element between the resting position and an abutment position, constituting an operating position;
   means for applying a difference in electrical potential between the other element constituting the signal electrode and an electrode which is fixed relative to the resonator element, the assembly formed by the resonator element, the other element constituting the signal electrode, the at least one resilient link and the means for applying a difference in electrical potential constituting an electrostatic motor having an adjustable air-gap as a function of the applied difference in potential, which enables the residual gap to be reduced to an operating gap equal to the difference between that residual gap and the abutment gap and smaller than the resolution of the micro-etching process, wherein the second resonator circuit is placed symmetrically opposite the first resonator circuit, and the first and second resonator circuits are arranged head to tail symmetrically relative to an axis at right-angles to the longitudinal axis of symmetry of each of the resonator circuits.

2. The resonator circuit according to claim 1, wherein the mechanical resonance frequency of the element represents the operating frequency of the signal of the resonator circuit in lateral vibration mode.

3. The resonator circuit according to claim 1, wherein it has a structure that is substantially symmetrical relative to a longitudinal axis of symmetry substantially parallel with the direction of the residual gap.

4. The resonator circuit according to claim 3, wherein it comprises, placed symmetrically relative to the longitudinal axis of symmetry:

a first and a second spring each providing a resilient link;

a set of two stop blocks enabling the other element constituting the signal electrode to be maintained in the operating position.

5. The resonator circuit according to claim 2, wherein it has a structure that is substantially symmetrical relative to a longitudinal axis of symmetry substantially parallel with the direction of the residual gap.

* * * * *